United States Patent
Koyama

(10) Patent No.: US 9,379,665 B2
(45) Date of Patent: Jun. 28, 2016

(54) OSCILLATOR

(71) Applicant: CANON KABUSHIKI KAISHA, Tokyo (JP)

(72) Inventor: Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/521,293

(22) Filed: Oct. 22, 2014

(65) Prior Publication Data

US 2015/0123741 A1 May 7, 2015

(30) Foreign Application Priority Data

Nov. 7, 2013 (JP) .................................. 2013-231577

(51) Int. Cl.
*H03B 7/08* (2006.01)
*H03B 7/00* (2006.01)

(52) U.S. Cl.
CPC .. *H03B 7/08* (2013.01); *H03B 7/00* (2013.01); *H03B 2200/0084* (2013.01)

(58) Field of Classification Search
CPC ..... H03B 7/00; H03B 7/08; H03B 2200/0084
USPC ........................................ 331/107 T, 107 SL
See application file for complete search history.

(56) References Cited

U.S. PATENT DOCUMENTS

| 2012/0001698 A1* | 1/2012 | Koyama | ................... | H03B 7/08 331/107 T |
| 2014/0292428 A1* | 10/2014 | Koyama | ................... | H03B 7/08 331/107 T |

FOREIGN PATENT DOCUMENTS

| JP | 2006-101495 A | 4/2006 |
| JP | 2007-124250 A | 5/2007 |
| JP | 2010-252299 A | 11/2010 |

OTHER PUBLICATIONS

Masahiro Asada, et al. "Resonant Tunneling Diodes for Sub-Terahertz and Terahertz Oscillators" Japanese Journal of Applied Physics, vol. 47, No. 6, 2008, pp. 4375-4384.

* cited by examiner

*Primary Examiner* — Richard Tan
(74) *Attorney, Agent, or Firm* — Canon USA, Inc., IP Division

(57) ABSTRACT

A terahertz wave oscillator that oscillates includes a negative resistance element, a resonator including a first conductor, a second conductor, and a dielectric, and a transmission line configured to supply a bias voltage to the negative resistance element. In this case, the negative resistance element and the dielectric are disposed between the first conductor and the second conductor, and the first conductor and the transmission line are connected at a node of an electric field of terahertz waves having oscillation frequency $f_{OSC}$ and standing in the resonator.

14 Claims, 6 Drawing Sheets

OSCILLATOR

BACKGROUND OF THE INVENTION

1. Field of the Invention

The present invention relates to oscillators using a negative resistance element, and it particularly relates to an oscillator for oscillating high frequency electromagnetic waves (hereinafter, called terahertz waves) having an arbitrary frequency band from a millimeter-wave band to a terahertz-wave band (equal to or higher than 30 GHz and equal to or lower than 30 THz).

2. Description of the Related Art

For many organic molecules of biological materials, medicines and electronic materials, for example, terahertz-wave frequency regions may have absorption peaks derived from their structures and states. Terahertz waves may have high permeability to materials such as paper, ceramics, resins, and fabrics. In recent years, imaging technologies and sensing technologies using such features of terahertz waves have been studied and developed. For example, applications to safer fluoroscopic inspection devices instead of X-ray systems and in-line non-destructive inspection apparatuses in preparation processes have been expected.

An oscillator having a resonator integrated with a negative resistance element has been well known as a current injection light source that generates electromagnetic waves in such frequency regions. Japanese Patent Laid-Open No. 2007-124250 discloses a terahertz wave oscillator including a negative resistance element having a double-barrier resonant tunneling diode (RTD) and a resonator having a slot antenna, which are integrated on a conductive substrate. The oscillator uses a differential negative resistance based on intersubband transition of electrons within a semiconductor quantum well structure of the RTD to oscillate terahertz waves at room temperature.

Japanese Patent Laid-Open No. 2006-101495 discloses a terahertz-wave oscillator including an RTD and a microstrip resonator integrated on one substrate.

As disclosed in Japanese Patent Laid-Open No. 2007-124250, such an oscillator using a negative resistance element may require a bias circuit to adjust bias voltage of the negative resistance element. A structure may further be required to cause a bias circuit to have lower impedance in a frequency region equal to or higher than DC and lower than $f_{OSC}$ so that low frequency parasitic oscillations due to the bias circuit may be suppressed. Here, the term $f_{OSC}$ refers to a terahertz wave frequency (oscillation frequency) oscillated by an oscillator, and the term "parasitic oscillation" refers to parasitic oscillation in a lower frequency band that is different from a desirable oscillation frequency $f_{OSC}$ of an oscillator.

On the other hand, connection of such a bias circuit and a structure for suppressing parasitic oscillation may result in leakage and losses of terahertz waves at the oscillation frequency $f_{OSC}$ within the resonator, which may reduce the oscillation output. For example, Japanese Patent Laid-Open No. 2007-124250 proposes a method for providing a stub line across a slot antenna for reducing such losses. An oscillator using a microstrip resonator as disclosed in Japanese Patent Laid-Open No. 2006-101495 may also require a structure for reducing terahertz wave losses of oscillation frequency $f_{OSC}$.

SUMMARY OF THE INVENTION

According to an aspect of the present invention there is provided a terahertz wave oscillator including a negative resistance element, a resonator including a first conductor, a second conductor, and a dielectric, and a transmission line configured to supply a bias voltage to the negative resistance element, wherein the negative resistance element and the dielectric are disposed between the first conductor and the second conductor, and the first conductor and the transmission line are connected at a node of an electric field of terahertz waves having oscillation frequency $f_{OSC}$ and standing in the resonator.

Further features of the present invention will become apparent from the following description of exemplary embodiments with reference to the attached drawings.

DESCRIPTION OF THE EMBODIMENTS

Figure 1A:
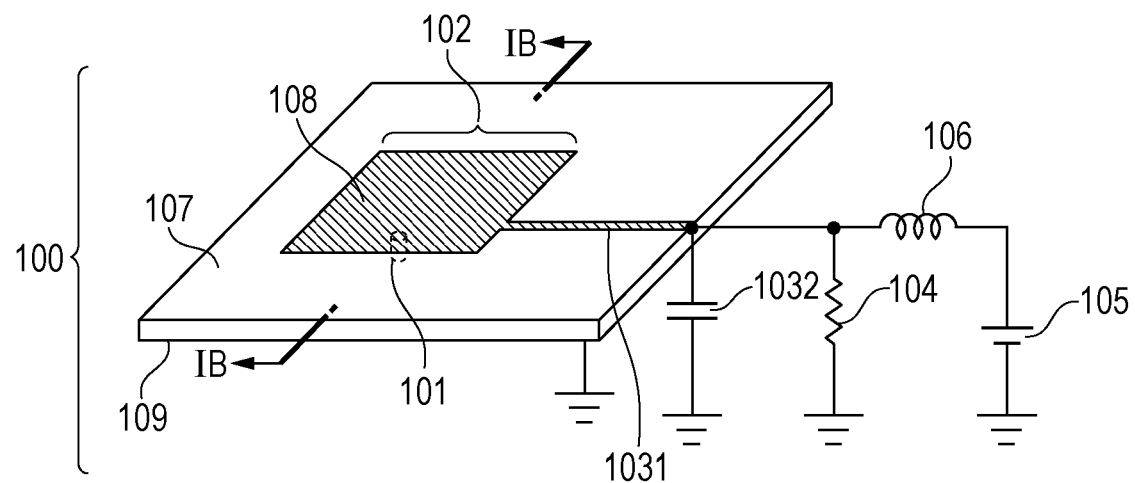
FIG. 1A illustrates a configuration of an oscillator according to an embodiment.
Figure 1B:
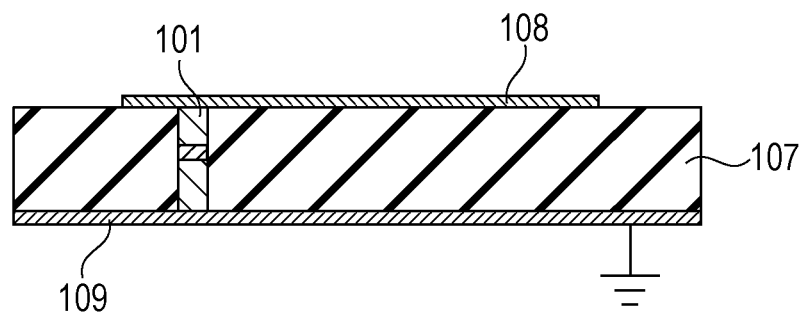
FIG. 1B is a cross section view of an oscillator according to an embodiment.

An oscillator 100 according to an embodiment will be described with reference to FIG. 1A and FIG. 1B. FIG. 1A is a perspective view illustrating a configuration of the oscillator 100 according to this embodiment, and FIG. 1B is a cross section view taken on line IB-IB.

First, a configuration of the oscillator 100 will be described. The oscillator 100 includes a negative resistance element (a negative differential resistance element) 101, a patch antenna 102 as a resonator, a strip conductor 1031 as a line, a low impedance circuit having a capacitance 1032 and a resistance 104 and a bias circuit having a power supply 105 and wiring 106.

The negative resistance element 101 is an element in having a region in which the amount of current decreases as the amount of voltage increases in a current-voltage characteristic, that is, a negative resistance region. The negative resistance element 101 is typically suitable for high frequency elements such as a resonance tunneling diode (RTD), an Esaki diode, a GUNN diode and a transistor having one end terminated.

For example, such a transistor may be a TUNNETT diode, an IMPATT diode, or a Hetero junction Bipolar Transistor (HBT). Alternatively, it may be a compound semiconductor field effect transistor (FET) or high electron mobility transistor (HEMT). A superconductor Josephson element may be used as a negative resistance instead. According to this embodiment, an RTD that is a typical negative resistance element acting in a terahertz wave band is used as the negative resistance element 101.

The patch antenna 102 is a microstrip resonator including a microstrip line having a finite length and generates terahertz waves. The patch antenna 102 includes a dielectric 107, a patch conductor (first conductor) 108, and a grounding conductor (second conductor) 109. The dielectric 107 is sandwiched between the patch conductor 108 and the grounding conductor 109.

The negative resistance element 101 is embedded within the patch antenna 102 and functions as an excitation source of terahertz waves. The negative resistance element 101 and the dielectric 107 are disposed in parallel. The negative resistance element 101 is electrically connected to the patch conductor 108 and grounding conductor 109. The strip conductor 1031 and patch conductor 108 which are transmission lines are connected at a node of an electric field of terahertz waves having oscillation frequency $f_{OSC}$ and standing in the patch antenna 102.

Here, the dielectric 107 is a substance having dielectricity dominant over conductivity and may be used as a material which behaves as an insulator or a high resistor that does not transmit electricity with direct current voltage. Concrete examples of the dielectric 107 in a terahertz wave band may include plastic, ceramic, silicon oxide, and silicon nitride.

The patch antenna 102 may be a resonator substantially defined such that the width in the IB-IB direction of the patch conductor 108 is equal to half of the wavelength of a terahertz wave at an arbitrary resonance frequency $f_0$. The patch antenna 102 is an active antenna in which the negative resistance element 101 functioning as an excitation source of terahertz waves is integrated. Thus, the oscillation frequency $f_{OSC}$ defined by the patch antenna 102 of the oscillator 100 is determined as a resonance frequency for a parallel resonance circuit having a combination of reactances of the patch antenna 102 and the negative resistance element 101. It should be noted that the term "oscillation frequency $f_{OSC}$" herein refers to a frequency of electromagnetic waves oscillated by an oscillator.

More specifically, the oscillation frequency $f_{OSC}$ may be acquired from an equivalent circuit of an RTD oscillator disclosed in Jpn. J. Appl. Phys., Vol. 47, No. 6 (2008), pp. 4375-4384 in the following manner. That is, the frequency that satisfies two conditions of Expression (1) and Expression (2) may be determined as the oscillation frequency $f_{OSC}$ with respect to a parallel resonance circuit having a combination of admittance $Y_{RTD}$ of the negative resistance element (RTD) 101 and admittance $Y_{ANT}$ of the patch antenna 102.

$$\text{Amplitude Condition: } Re[Y_{RTD}] + Re[Y_{ANT}] \leq 0 \quad (1)$$

$$\text{Phase Condition: } Im[Y_{RTD}] + Im[Y_{ANT}] = 0 \quad (2)$$

where $Re[Y_{RTD}]$ is an admittance of the negative resistance element and has a negative value. It should be noted that the oscillation frequency $f_{OSC}$ may be acquired under an amplitude condition and a phase condition as described above even when other negative resistance element than an RTD is used.

Thus, the oscillation frequency $f_{OSC}$ of the oscillator 100 may sometimes be different from a resonance frequency $f_0$ of the patch antenna 102 mainly dependent on $Im[Y_{ANT}]$ due to an effect of $Im[Y_{RTD}]$ of the negative resistance element 101.

A bias circuit usable for adjusting a bias voltage of the negative resistance element 101 includes the power supply 105 and wiring 106. Because the wiring 106 always involves a parasitic inductance component, it is shown as an inductance in FIG. 1A. The power supply 105 supplies a current necessary for driving the negative resistance element 101 band adjusts the bias voltage. The bias voltage is typically selected from a negative resistance region of the negative resistance element 101.

The strip conductor 1031 is a transmission line that plays role in supplying the bias voltage from the bias circuit including the power supply 105 and wiring 106 to the negative resistance element 101 and is connected to the patch conductor 108.

The resistance 104 and the capacitance 1032 connected thereto in parallel form a low impedance circuit. The low impedance circuit may suppress parasitic oscillations caused by resonances at a relatively lower frequency due to the bias circuit including the power supply 105 and wiring 106.

The resistance 104 has a value selected to be equal to an absolute value of the negative resistance in the negative resistance region of the negative resistance element 101 or to be lower than the absolute value. Like the resistance 104, the capacitance 1032 is also defined such that the impedance of the capacitance 1032 may be equal to or lower than the absolute value of the negative resistance of the negative resistance element 101 in a microwave frequency band. The capacitance 1032 is preferably higher and has approximately several pF according to this embodiment.

The capacitance 1032 may be a decoupling capacitance directly connected to the strip conductor 1031. For example, in order to integrate the capacitances on one substrate, a Metal-insulator-Metal (MIM) structure may be utilized in which the capacitance 1032 and the patch antenna 102 are integrated on one substrate.

The strip conductor 1031 in the oscillator 100 according to this embodiment is disposed at a node of an electric field of terahertz waves having oscillation frequency $f_{OSC}$ and standing in the patch antenna 102. The oscillation frequency $f_{OSC}$ in the terahertz wave band defined by the patch antenna 102 and the negative resistance element 101. In other words, the patch conductor 108 and the strip conductor 1031 are connected through a node of an electric field of the terahertz waves having oscillation frequency $f_{OSC}$ and standing in the patch antenna 102 functioning as a resonator.

The expression "a node of an electric field of terahertz waves having oscillation frequency $f_{OSC}$ and standing in a/the resonator" herein refers to a region that is virtually a node of a terahertz-wave electric field at the standing oscillation frequency $f_{OSC}$ in the resonator. More specifically, it refers to a region where the intensity of the terahertz-wave electric field (hereinafter, called THz field intensity) at the oscillation frequency $f_{OSC}$ standing in a resonator is lower by about 1 digit than a maximum THz field intensity at the oscillation frequency $f_{OSC}$ standing in the resonator. Desirably, it refers to a region where THz field intensity at the oscillation frequency $f_{OSC}$ is equal to or lower than $1/e^2$ (where e is a base of a natural logarithm) of a maximum THz field intensity at the oscillation frequency $f_{OSC}$ standing in the resonator. Hereinafter, the expression "a node of an electric field of a terahertz-wave having oscillation frequency $f_{OSC}$ and standing in a/the resonator" will sometimes be called "a node of a terahertz-wave electric field standing in a patch antenna" or "a node of a terahertz-wave electric field at the oscillation frequency $f_{OSC}$", for example.

As described above, an oscillator in which a negative resistance element such as the oscillator 100 according to this embodiment and a patch antenna that is a resonance antenna are integrated may have some designs which cause the oscillation frequency $f_{OSC}$ of the oscillator to be different from the resonance frequency $f_0$ of the patch antenna that is a resonator. This is because of an effect of $Im[Y_{RTD}]$ in Expression (2).

More specifically, $Im[Y_{RTD}]$ contains a capacitive reactance ωC and an inductive reactance 1/ωL that are products of a capacitance C and an inductance L of a negative resistance element and an angular frequency co. Thus, as the frequency of electromagnetic waves such as terahertz waves increases, the effect of $Im[Y_{RTD}]$ in Expression (2) increases significantly. The present inventors have found that a difference between the resonance frequency $f_0$ of the patch antenna and the oscillation frequency $f_{OSC}$ in the oscillator also has an influence on the distribution of the terahertz-wave electric field standing in the resonator.

More specifically, the distribution of the electric field generated when the terahertz waves at the oscillation frequency $f_{OSC}$ stand in a resonator may be different from the distribution of the electric field generated when the terahertz waves at the resonance frequency $f_0$ stands in the resonator. In other words, focusing on a node of a terahertz-wave electric field standing in a patch antenna that is a resonator, a node of a terahertz-wave electric field at the resonance frequency $f_0$ is positioned above a centerline of the patch antenna. On the other hand, a node of a terahertz-wave electric field at the oscillation frequency $f_{OSC}$ is positioned in a region excluding the centerline of the patch antenna.

Notably, the centerline of the resonator (patch antenna) is a straight line orthogonal to the direction of resonance of terahertz waves and crossing the barycenter of a patch conductor that is a first conductor.

Thus, disposing a transmission line at a node of a terahertz-wave electric field at the oscillation frequency $f_{OSC}$, instead of a node of terahertz-wave electric field at the resonance frequency $f_0$ of the patch antenna, may reduce losses of terahertz waves.

This is because such a configuration may cause the transmission line 1031 and the bias circuit connected thereto to have higher impedance at the oscillation frequency $f_{OSC}$, viewed from the negative resistance element. Therefore, because leakage of terahertz waves around the oscillation frequency $f_{OSC}$ from a resonator and losses due to external interferences may be reduced, higher output characteristics of the oscillator and stable frequencies may be achieved. This will be described according to the first exemplary embodiment, which will be described below, with reference to specific examples.

The expression "high impedance" herein typically refers to higher impedance than an absolute value of a differential negative resistance of a negative resistance element. As the impedance at the oscillation frequency $f_{OSC}$ increases, the influences from the transmission line and the bias circuit external to the transmission line may be reduced. Accordingly, in the oscillator 100 of this embodiment, the patch conductor 108 and the transmission line 1031 are connected through a node of a terahertz-wave electric field at the oscillation frequency $f_{OSC}$ standing in the resonator 102.

The configuration of this embodiment may cause a higher impedance of the patch antenna 102 than that caused in a case where the transmission line 1031 is connected to a node of an electric field generated when terahertz waves at the resonance frequency $f_0$ stand in the patch antenna 102. In other words, because $Re[Y_{ANT}]$ that is a reciprocal of the impedance of the patch antenna 102 decreases, the losses of terahertz waves due to the transmission line 1031 and bias circuit may be reduced.

Therefore, even in an oscillator using a microstrip resonator such as a patch antenna, losses of terahertz waves due to a feeding structure for a desirable oscillation frequency $f_{OSC}$ defined by the resonator may be reduce. As a result, a higher output characteristic of terahertz waves may be achieved.

Variation examples of the oscillator 100 according to this embodiment will be described below. The description on the same components as those in the oscillator 100 will be omitted.

Figure 5A:
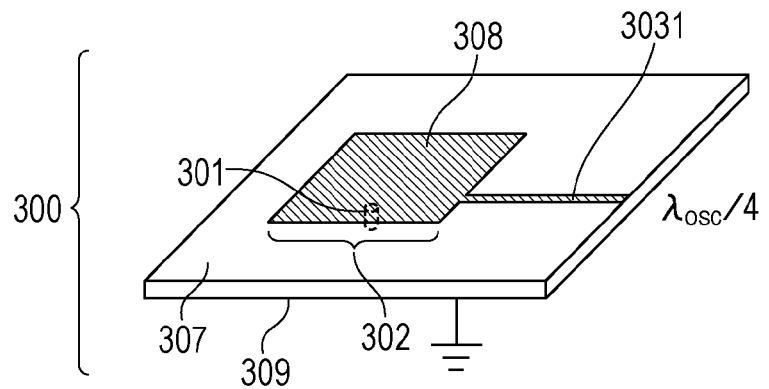
FIG. 5A illustrates a configuration of an oscillator according to a first variation example.

FIG. 5A illustrates a configuration of an oscillator 300 according to a first variation example of this embodiment. The oscillator 300 has a strip conductor 3031 that is a $\lambda_{OSC}/4$ transmission line. The term "$\lambda_{OSC}/4$ transmission line" refers to a transmission line being the strip conductor 3031 having a length substantially equal to $\lambda_{OSC}/4$. The length $\lambda_{OSC}$ is equal to the wavelength of terahertz waves at the oscillation frequency $f_{OSC}$ defined by a patch antenna 302 and a negative resistance element 301 and will be called an oscillation wavelength $\lambda_{OSC}$ hereinafter.

The patch antenna 302 includes a dielectric 307, a patch conductor 308, and a grounding conductor 309, and the dielectric 307 is sandwiched between the patch conductor 308 and the grounding conductor 309. A short-ended $\lambda_{OSC}/4$ transmission line may have a higher impedance viewed from the patch antenna 302 because the strip conductor 3031 against the oscillation wavelength $\lambda_{OSC}$ may be handled as a short circuit stub. Connection between the patch conductor 308 and the strip conductor 3031 at a node of a terahertz-wave electric field standing in the patch antenna 302 may reduce losses of terahertz waves.

In this case, because a predetermined or lower level of losses may only be required, the length L of the strip conductor 3031 may be around $\lambda_{OSC}/4$. Instead of $\lambda_{OSC}/4$, it may be (2m−1) times of $\lambda_{OSC}/4$ (m: natural number) such as $3\lambda_{OSC}/4$, and $5\lambda_{OSC}/4$.

Figure 5B:
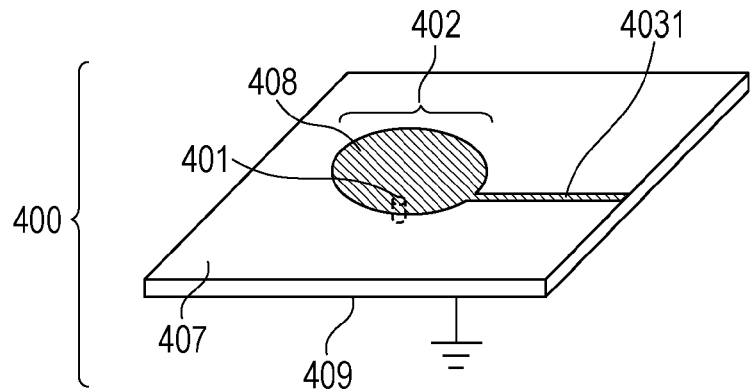
FIG. 5B illustrates a configuration of an oscillator according to a second variation example.

FIG. 5B illustrates a configuration of an oscillator 400 according to a second variation example of this embodiment. The shape of the patch antenna is not limited to a square, but a circular patch conductor 408 as in the oscillator 400 in FIG. 5B may be used, for example. A possible structure may include a polygonal patch conductor such as a rectangular and triangular patch conductor or an elliptical patch conductor. A patch antenna 402 includes a dielectric 407, a patch conductor 408, and a grounding conductor 409. The dielectric 407 is disposed between the patch conductor 408 and the grounding conductor 409.

Also in this case, connection between the patch conductor 408 and the transmission line 4031 at a node of a terahertz-wave electric field standing in the patch antenna 402 may reduce losses of terahertz waves. The transmission line may be disposed at a position close to or away from the negative resistance element 401 with respect to the barycenter of the patch conductor depending on the geometrical structure of the patch antenna 402.

Figure 5C:
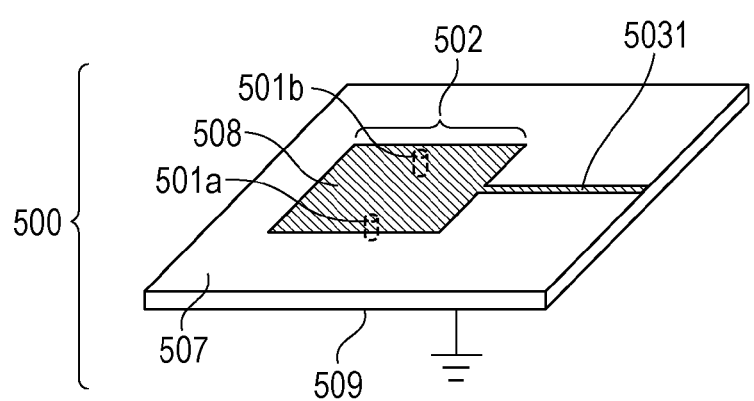
FIG. 5C illustrates a configuration of an oscillator according to a third variation example.

FIG. 5C illustrates a configuration of an oscillator 500 according to a third variation example of this embodiment. The third variation example is an example of an oscillator having a plurality of negative resistance elements. The disclosed oscillator 500 has a push-pull oscillator in which two negative resistance elements 501a and 501b are arranged line symmetrically about a centerline of the patch antenna 502 with respect to the direction of resonance of a terahertz-wave electric field standing in the patch antenna 502. Also in this example, the patch antenna 502 includes a dielectric 507, a patch conductor 508, and a grounding conductor 509, and the dielectric 507 is disposed between the patch conductor 508 and the grounding conductor 509, like the aforementioned examples.

In this case, a terahertz-wave electric field at the oscillation frequency $f_{OSC}$ standing in the patch antenna 502 is line symmetrical about the centerline of the patch antenna 502, and the positions of nodes of the terahertz-wave electric field at the oscillation frequency $f_{OSC}$ distribute near the centerline of the patch antenna 502. Thus, in this case, a strip line 5031 may be arranged near the centerline of the patch antenna 502.

Figure 6A:
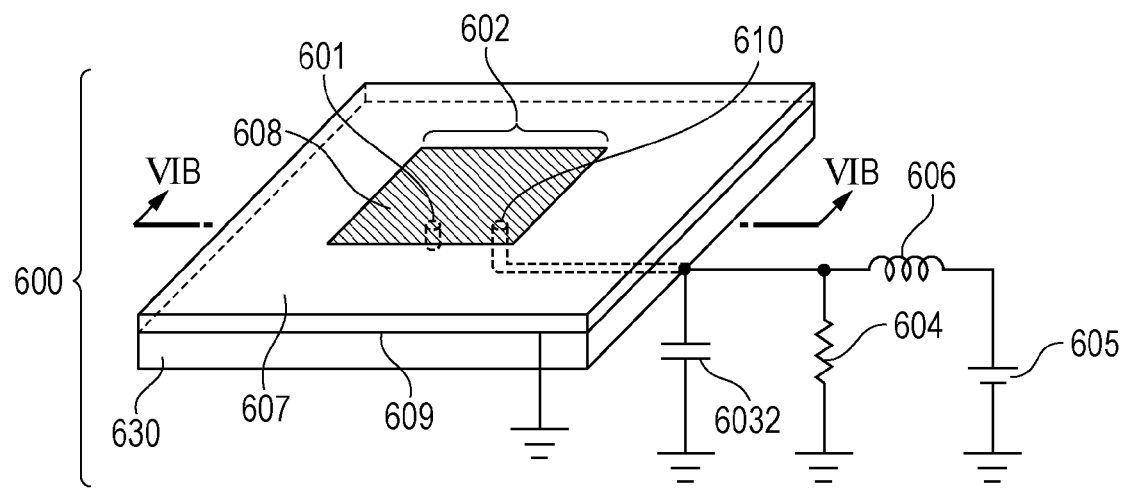
FIG. 6A illustrates a configuration of an oscillator according to a fourth variation example.
Figure 6B:
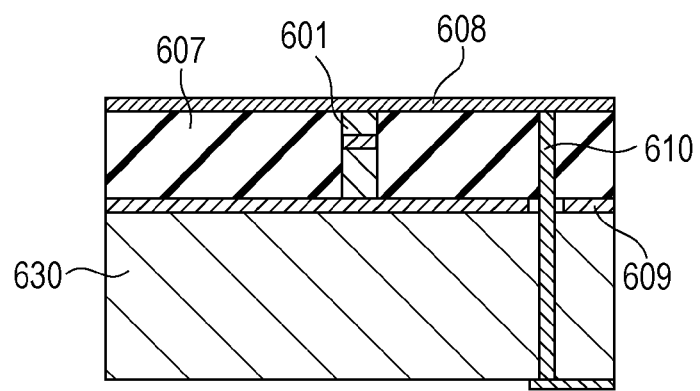
FIG. 6B is a cross section view of the oscillator according to the fourth variation example.

A fourth variation example of this embodiment will be described with reference to FIG. 6A and FIG. 6B. FIG. 6A illustrates a configuration of an oscillator 600 according to the fourth variation example, and FIG. 6B illustrates a section view taken at line VIB-VIB. The oscillator 600 includes a through electrode 610 extending in the direction of thickness of a substrate 630. The through electrode 610 functions as a transmission line connected to a bias circuit for adjusting a bias voltage of an RTD 601 that is a negative resistance element. The rest of the configuration is the same as that of the oscillator 100 and has a low impedance circuit including an RTD 601, a patch antenna 602, a capacitance 6032 and a resistance 604 and a bias circuit including a power supply 605 and a line 606. The patch antenna 602 includes a dielectric 607, a patch conductor 608 and a grounding conductor 609, and the dielectric 607 is disposed between the patch conductor 608 and the grounding conductor 609.

The through electrode 610 is positioned at a node of an terahertz-wave electric field at the oscillation frequency $f_{OSC}$ standing in the patch antenna 602. The through electrode 610 is preferably arranged typically at a position where the THz field intensity at the oscillation frequency $f_{OSC}$ standing in the patch antenna 602 is lower by about 1 digit than a maximum field intensity and may be any position within a region of a node of a terahertz-wave electric field at the oscillation frequency $f_{OSC}$.

Feeding with the through electrode 610 extending in the direction of thickness of the substrate 630 may suppress inductance due to the dimensions of a structure of the transmission line and is advantageous for reducing the size of involved elements and arranging an involved array of elements.

This embodiment discloses a configuration of a microstrip resonator in which a negative resistance element is integrated and in which a transmission line connected to a bias circuit which adjusts a bias voltage for the negative resistance element is arranged at a node of an electric field at the oscillation frequency $f_{OSC}$ in a terahertz band standing in the resonator. This configuration may cause a high impedance in the transmission line and the bias circuit connected to the transmission line near a desirable oscillation frequency $f_{OSC}$ in a terahertz band, which may reduce losses of terahertz waves due to leakage thereof. In other words, the oscillator 100 of this embodiment and the oscillators according to the first to fourth variation examples may reduce losses of oscillating terahertz waves. Therefore, because even an oscillator using a microstrip resonator may reduce losses of terahertz waves due to its feeding structure, high output of oscillation frequency $f_{OSC}$ may be acquired in a desirable terahertz band defined by the resonator.

First Exemplary Embodiment

Figure 2A:
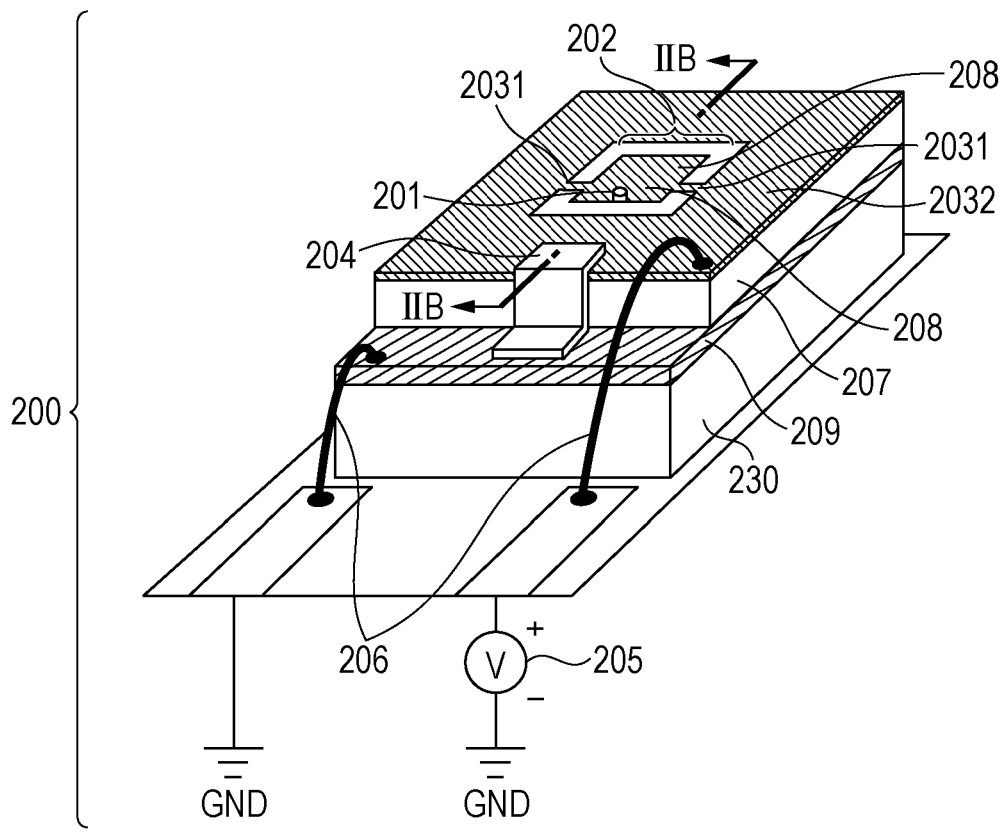
FIG. 2A illustrates a configuration of an oscillator according to a first exemplary embodiment.
Figure 2B:
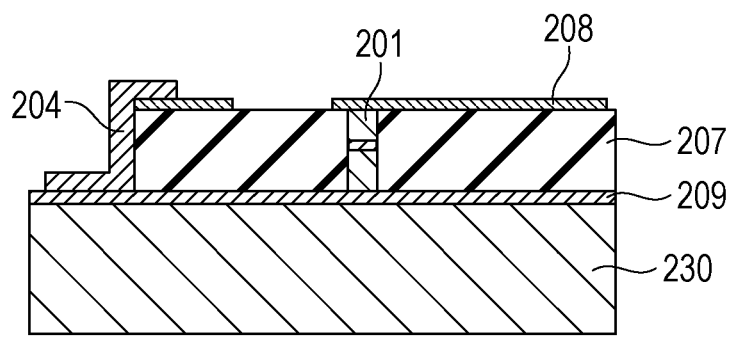
FIG. 2B is a cross section view of an oscillator according to the first exemplary embodiment.

An oscillator 200 according to a first exemplary embodiment will be described with reference to FIG. 2A and FIG. 2B. FIG. 2A illustrates a configuration of the oscillator 200 according to this exemplary embodiment, and FIG. 2B is a section view taken at line IIB-IIB of FIG. 2A illustrating the oscillator 200. The oscillator 200 is an oscillator configured to generate an oscillation frequency $f_{OSC}$=0.95 THz. Repetitive description on the same components as those according to the aforementioned embodiments will be omitted.

According to this exemplary embodiment, a resonant tunneling diode (RTD) is used as a negative resistance element 201. The RTD used in this exemplary embodiment includes InGaAs/AlAs on an InP substrate 230, a multiple quantum well structure with InGaAs/InAlAs and an electrical contact layer with n-InGaAs, for example.

The multiple quantum well structure may be a triple-barrier structure, for example. More specifically, the multiple quantum well structure may be a semiconductor multi-layer film structure containing AlAs (1.3 nm)/InGaAs (7.6 nm)/InAlAs (2.6 nm)/InGaAs (5.6 nm)/AlAs (1.3 nm). Among them, InGaAs corresponds to a well layer, and lattice-matched InAlAs and mismatched AlAs correspond to wall layers. These layers are undoped where carriers are not doped intentionally.

This multiple quantum well structure is sandwiched between electrical contact layers of n-InGaAs having an electron concentration of $2\times10^{18}$ cm$^{-3}$. The current-voltage I (V) characteristic of the structure between the electrical contact layers has a peak current density of 280 kA/cm$^2$ and a negative resistance region from about 0.7 V to about 0.9 V. In a case where the RTD has a mesa structure of about 2 μmΦ, a peak current of 10 mA and a negative resistance of −20Ω may be obtained.

A patch antenna 202 is a square patch including a patch conductor 208 having sides of 60 μm each. A dielectric 207 that is 3-μm thick BCB (Benzocyclobutene, The Dow Chemical Company, specific permittivity $\epsilon_r$=2.4) is disposed between a patch conductor 208 and a grounding conductor 209. A 2-μm diameter RTD 201 is connected between the patch conductor 208 and the grounding conductor 209. The RTD 201 is disposed as a position away by 24 μm in the direction of resonance from the barycenter of the patch conductor 208.

The resonance frequency $f_0$ of the patch antenna 202 depends on a passive structure excluding the negative resistance element (RTD) 201 and is equal to about 1.5 THz. On the other hand, in consideration of reactance of the RTD 201, the oscillation frequency $f_{OSC}$ of the oscillator 200 is equal to about 0.95 THz.

The patch conductor 208 is connected to a MIM capacitance 2032 as a capacitor through two strip conductors (transmission line) 2031 each having a width of 5 μm and a length of 15 μm. The capacitance size of the MIM capacitance 2032 is equal to 10 pF in this exemplary embodiment. A line 206 including a wire bonding is connected to the MIM capacitance 2032, and a power supply 205 adjusts a bias voltage to the RTD 201.

A resistor 204 functioning as a resistance is a parallel resistance arranged in parallel with the RTD 201 and connects with 20Ω between a conductor (upper conductor) above the MIM capacitance 2032 and the grounding conductor 209. The resistor 204 contains bismuth that is semimetal, and a 200 μm×200 μm×1 μm thick bismuth film is formed by a lift-off process to obtain 20Ω as resistance.

The resistor 204 may be a linear resistor including a conductive resin or a metal such as nickel chrome, or a non-liner resistor including a semiconductor. The line 206 formed by wire bonding has one end connected to a position of a conductor on the MIM capacitance 2032 and the other end connected to the power supply 205.

The strip conductor 2031 is arranged at a position away by 20 μm in the direction of resonance from the centerline of the patch antenna 202 crossing the barycenter of the patch conductor 208 (a=20 μm). Because the position is at a node of a terahertz-wave electric field standing in the patch antenna 202 at an oscillation frequency $f_{OSC}$=0.95 THz, the strip conductor 2031 does not interfere with an electric field that resonates at the oscillation frequency $f_{OSC}$ within the patch antenna 202.

The oscillator 200 according to this exemplary embodiment is fabricated as follows. First, on the InP substrate 230, a next layer is epitaxially grown by molecular beam epitaxial method (MBE) or metal-organic vapor-phase epitaxy (MOVPE). In other words, resonant tunneling diodes (RTDs) of n-InP/n-InGaAs and InGaAs/InAlAs are epitaxially grown in order. In a case where an n type conductive substrate is selected as the InP substrate 230, n-InGaAs may be epitaxially grown first.

Next, the RTD 201 is etched to an arc-shaped mesa so that the RTD 201 may have a diameter of 2 μm. The etching may be dry-etching by EB (electron beam) lithography and ICP (inductively coupled plasma). Alternatively, photolithography may be used. Next, the grounding conductor 209 is formed by a lift-off process on the etched plane. A passivation film may be formed for protecting sidewalls in the resonant tunneling diodes.

A BCB that is the dielectric 207 is embedded therein by spin coat method and dry-etching, and upper electrodes of the patch conductor 208, strip conductor 2031, and MIM capacitance 2032 of Ti/Pd/Au are formed by lift-off process. Finally, a Bi pattern is formed by a lift-off process on a part to be the resistor 204, and the upper electrodes of the grounding conductor 209 and the MIM capacitance 2032 are connected. Then, the oscillator 200 of this exemplary embodiment completes.

A bias voltage may be supply to the oscillator 200 from the bias circuit including the power supply 205 and line 206 as required through the strip conductor 2031 disposed at a node of a terahertz-wave electric field standing in the patch antenna 202. Normally, when a bias voltage in a negative resistance region of an RTD is applied to supply a bias current to the oscillator 200, the oscillator 200 functions.

Figure 3:
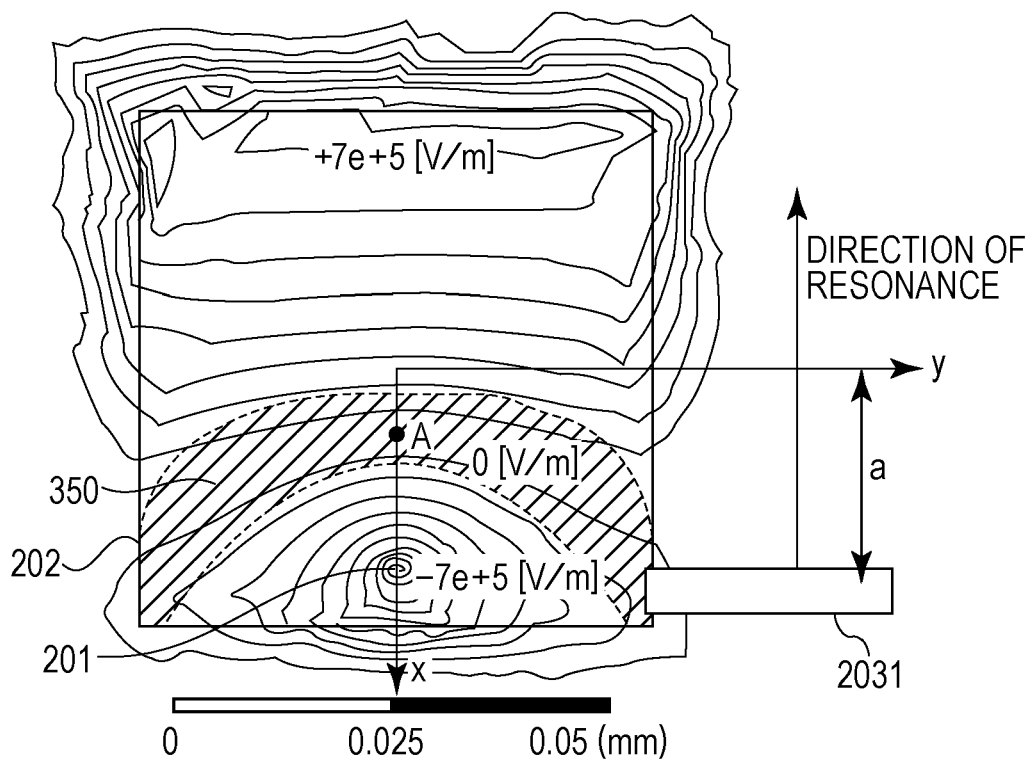
FIG. 3 illustrates a resonance electric field of an oscillator according to the first exemplary embodiment.
Figure 4A:
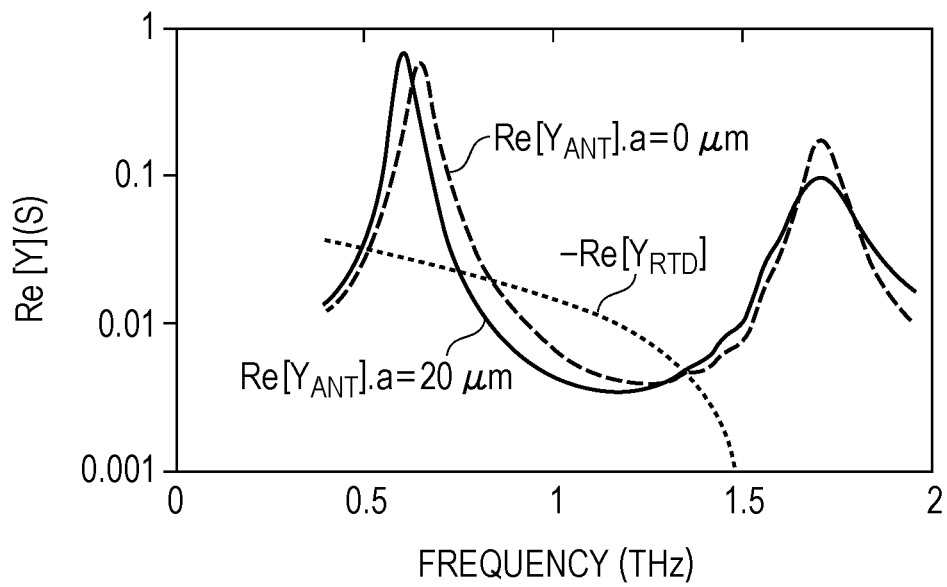
FIG. 4A is a graph plotting real part $Re[Y_{RTD}]$ of an admittance of a negative resistance element in an oscillator according to the first exemplary embodiment and a real part $Re[Y_{RTD}]$ of an admittance of a patch antenna.
Figure 4B:
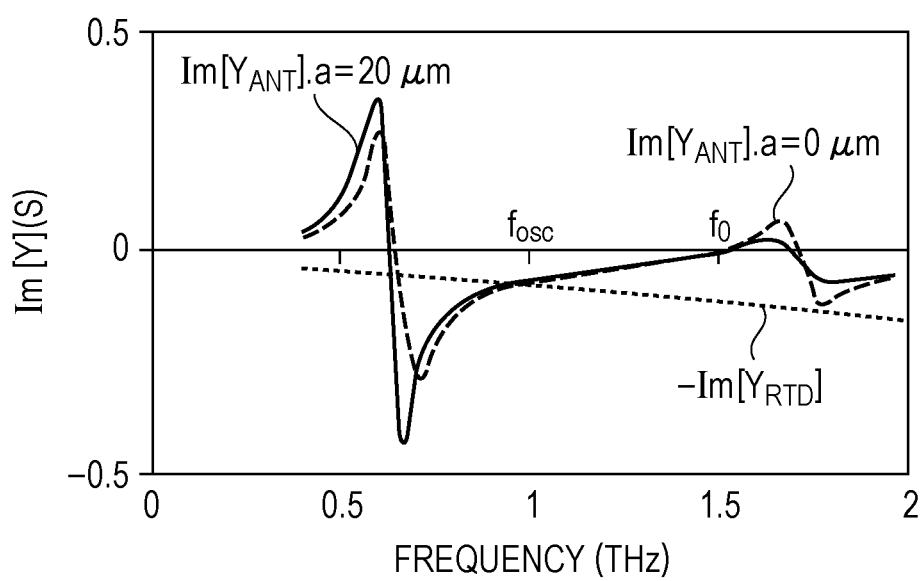
FIG. 4B is a graph plotting an imaginary part $Im[Y_{RTD}]$ of an admittance of a negative resistance element in an oscillator according to the first exemplary embodiment and an imaginary part $Im[Y_{RTD}]$ of an admittance of a patch antenna.

With reference to FIG. 3 and FIG. 4A, and FIG. 4B, effects will be described which are acquired from connection of the patch conductor 208 and the strip conductor 2031 at a node of a terahertz-wave electric field standing in the resonator 202 in the oscillator 200 according to this exemplary embodiment.

FIG. 3 illustrates a result of an analysis of a terahertz-wave electric field standing in the patch antenna 202 that is a square patch antenna at an oscillation frequency $f_{OSC}$ (=0.95 THz) in the oscillator 200. A high frequency simulator HFSS from ANSYS is used for the electric field analysis. For simplification of description, a configuration having one strip conductor 2031 will be described.

In a region 350 shaded in FIG. 3, the standing THz field intensity at the oscillation frequency $f_{OSC}$ is lower than a maximum field intensity by about 1 digit. More specifically, the THz field intensity at the oscillation frequency $f_{OSC}$ is equal to or lower than $1/e^2$ of the maximum field intensity. The region 350 is a typical example of a possible region to be a node of a terahertz-wave electric field standing in a resonator for connection between the patch conductor 208 and the strip conductor 2031.

The structure and dimensions of the strip conductor 2031 may fit within the region 350 to avoid interference with a terahertz-wave electric field standing in the patch antenna 202. Typically, the strip conductor 2031 may have a width equal to or shorter than 1/5 of resonator length L or a width equal to or shorter than 1/10 of the oscillation wavelength $\lambda_{OSC}$. In this case, the strip conductor 2031 may have an arbitrary length.

Because an active antenna that acts in a terahertz band may have a large frequency shift due to reactance of the RTD 201, the terahertz-wave electric field at the oscillation frequency $f_{OSC}$ standing in the patch antenna 202 may not always distribute symmetrically, as in FIG. 3.

For example, in the patch antenna 202 that is a square patch antenna, a node of a terahertz-wave electric field at the oscillation frequency $f_{OSC}$ distributes a region excluding the centerline of the patch antenna 202 or an axis where a=0 in FIG. 3. Particularly, when the RTD 201 is a capacitive reactance, the electric-field distribution may bias from the centerline (a=0) of the patch antenna 202 to the side having the RTD 201 in the direction of resonance (x direction). In this case, the strip conductor 2031 may be arranged at a position closer to the RTD 201 than the centerline of the patch antenna 202.

In order to address the bias of the electric-field distribution due to such inductive reactance, the strip conductor 2031 may be arranged at a position more away from the RTD 201 than the centerline of the patch antenna 202.

The distance a in FIG. 3 from the centerline to a non-radiating end of the patch antenna is a parameter indicative of a position where the transmission line such as the strip conductor 2031 is connected to the patch antenna 202.

FIG. 4A and FIG. 4B illustrate results of analyses of admittance characteristics of the oscillator 200 in which the RTD disclosed according to the first exemplary embodiment is integrated. FIG. 4A is a graph plotting a real part Re[$Y_{RTD}$] of admittance of the RTD 201 and a real part Re[$Y_{ANT}$] of admittance of the patch antenna 202. FIG. 4B is a graph plotting an imaginary part Im[$Y_{RTD}$] of admittance of the RTD 201 and an imaginary part Im[$Y_{ANT}$] of admittance of the patch antenna 202.

Those graphs are illustrated with respect to an oscillator including the strip conductor 2031 at a node (a=20 μm) of a terahertz-wave electric field at an oscillation frequency $f_{OSC}$ and an oscillator having the strip conductor 2031 at a node (a=0 μm) of an electric field at a resonance frequency $f_0$ of a conventional patch antenna.

Referring to FIG. 4B, the resonance frequency $f_0$ only depending on the structure of the patch antenna 202 equal to 1.5 THz, and the oscillation frequency $f_{OSC}$ that satisfies Expression (2) is equal to 0.95 THz. Referring to FIG. 4A, while Re[$Y_{ANT}$] at the oscillation frequency $f_{OSC}$ is 9 mS in a conventional element (a=0 μm), Re[$Y_{ANT}$] is 4 mS in an element (a=20 μm) in which the strip conductor 2031 is arranged at a node of a terahertz-wave electric field at the oscillation frequency $f_{OSC}$ disclosed in this exemplary embodiment.

This is because the negative resistance element (RTD) 201 according to this exemplary embodiment has high impedance in a frequency band near the oscillation frequency $f_{OSC}$ so that leakage of the terahertz-wave electric field within the patch antenna 202 through the strip conductor 2031 may be prevented.

In this way, in the oscillator 200, at a frequency near a desirable oscillation frequency $f_{OSC}$ in a terahertz wave band, an outer region of the patch antenna 202 viewed from the RTD 201, that is, the strip conductor 2031 and the bias circuit connected thereto may be regarded as having a high impedance structure. The reduction of losses due to leakage of terahertz waves at a frequency near the oscillation frequency $f_{OSC}$ from the patch antenna 202 may contribute to suppression of reduction of oscillation output. In other words, with the oscillator 200, losses of oscillating terahertz waves may be reduced.

In this configuration, the structure of the patch antenna and the size and arrangement of the strip conductor may be arbitrarily designed. High output characteristic of the oscillator 200 may be acquired by minimizing losses of terahertz waves at the oscillation frequency $f_{OSC}$.

According to this exemplary embodiment, the RTD is a triple barrier resonant tunneling diode including InGaAs/InAlAs and InGaAs/AlAs grown on an InP substrate. However, an embodiment of the present invention is not limited to the structure. A semiconductor element of the present invention may be provided by combinations of other structures and materials. For example, a resonant tunneling diode may be used which has a double barrier quantum well structure or a resonant tunneling diode having a multi-barrier quantum well structure.

Combinations of the following materials may be used therefor:
GaAs/AlGaAs/and GaAs/AlAs, InGaAs/GaAs/AlAs formed on a GaAs substrate
InGaAs/AlGaAsSb formed on an InP substrate
InAs/AlAsSb and InAs/AlSb formed on an InAs substrate
SiGe/SiGe formed on a Si substrate The structures and materials may be selected properly in accordance with a desired frequency, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Having described that terahertz waves are radiated into a space according to the embodiments, examples, and variation example, it may be configured such that terahertz waves may be generated as a signal having a high frequency, for example.

It has been described that according to the embodiments and examples, and variation examples, a patch conductor and a grounding conductor are handled as a first conductor and a second conductor, respectively, and a patch conductor and a transmission line are connected. However, instead of the configuration, a grounding conductor and a patch conductor may be handled as a first conductor and a second conductor, respectively, and a grounding conductor and a transmission line may be connected. In this case, connecting the grounding conductor and the transmission line at a node of a terahertz-wave electric field standing in a resonator may reduce losses of terahertz waves.

Having assumed a case where carriers are electrons according to the embodiments, exemplary embodiments, and variation examples, an embodiment of the present invention is not limited thereto. Positive holes (or holes) may be used instead.

Materials of substrates and dielectrics may be selected as usage, semiconductors of silicon, Gallium Arsenide, Indium Arsenide, or gallium phosphide or resins of glass, ceramic, Teflon (registered trademark) or polyethylene terephthalate.

This application claims the benefit of Japanese Patent Application No. 2013-231577, filed Nov. 7, 2013, which is hereby incorporated by reference herein in its entirety.

What is claimed is:

1. A terahertz wave oscillator comprising:
a negative resistance element;
a resonator including a first conductor, a second conductor, and a dielectric; and
a transmission line configured to supply a bias voltage to the negative resistance element, wherein
the negative resistance element and the dielectric are disposed between the first conductor and the second conductor,
wherein the first conductor and the transmission line are connected at a node of an electric field of terahertz waves having oscillation frequency $f_{osc}$ and standing in the resonator, and
wherein the node of the electric field of the terahertz waves is a region where intensity of the electric field of the terahertz waves standing in the resonator is equal to or lower than $1/e^2$ of a maximum field intensity, "e" representing a base of a natural logarithm.

2. The oscillator according to claim 1 the transmission line and the bias circuit at a frequency of the terahertz waves has high impedance.

3. The oscillator according to claim 1, wherein
the negative resistance element is disposed at a position displaced from a barycenter of the first conductor;
the first conductor and the transmission line are connected at a position close to or away from the negative resistance element with respect to a straight line orthogonal to a straight line connecting the barycenter of the first conductor and the negative resistance element and crossing the barycenter.

4. The oscillator according to claim 3, wherein
the negative resistance element has capacitive reactance; and
the first conductor and the transmission line are connected at a position close to the negative resistance element with respect to a straight line orthogonal to a straight line connecting the barycenter of the first conductor and the negative resistance element and crossing the barycenter.

5. The oscillator according to claim 3, wherein
the negative resistance element has inductive reactance; and
the first conductor and the transmission line are connected at a position away from the negative resistance element with respect to a straight line orthogonal to a straight line connecting the barycenter of the first conductor and the negative resistance element and crossing the barycenter.

6. The oscillator according to claim 1, comprising a plurality of negative resistance elements.

7. The oscillator according to claim 6, wherein the plurality of negative resistance elements are arranged about a straight line orthogonal to a straight line connecting a barycenter of the first conductor and the negative resistance element and crossing the barycenter.

8. The oscillator according to claim 1, wherein the frequency of the terahertz waves is different from a resonance frequency of the resonator.

9. The oscillator according to claim 1, comprising a plurality of transmission lines.

10. The oscillator according to claim 9, wherein the plurality of the transmission lines are arranged symmetrically about a straight line connecting a barycenter of the first conductor and the negative resistance element.

11. The oscillator according to claim 1, comprising a capacitance and a resistance between the transmission line and the bias circuit, the capacitance and resistance being connected with the negative resistance element in parallel.

12. The oscillator according to claim 1, wherein the resonator includes a patch antenna.

13. The oscillator according to claim 1, wherein the transmission line has a length of $(2m-1)\lambda_{osc}/4$ (m: natural number) where the terahertz waves has a wavelength of $\lambda_{osc}$.

14. The oscillator according to claim 1, wherein the negative resistance element includes a resonant tunneling diode.

\* \* \* \* \*